US008264394B2

(12) United States Patent
Liu

(10) Patent No.: US 8,264,394 B2
(45) Date of Patent: Sep. 11, 2012

(54) ANALOG-TO-DIGITAL CONVERTING CIRCUIT

(75) Inventor: Ming-Huang Liu, Hsinchu County (TW)

(73) Assignee: Sitronix Technology Corp., Hsinchu County (TW)

(*) Notice: Subject to any disclaimer, the term of this patent is extended or adjusted under 35 U.S.C. 154(b) by 21 days.

(21) Appl. No.: 12/852,701

(22) Filed: Aug. 9, 2010

(65) Prior Publication Data

US 2011/0291870 A1 Dec. 1, 2011

(30) Foreign Application Priority Data

May 25, 2010 (TW) .............................. 99116612 A

(51) Int. Cl.
*H03M 1/50* (2006.01)
(52) U.S. Cl. ....................................... 341/166; 341/155
(58) Field of Classification Search .................. 341/155, 341/162, 166, 168, 169, 167
See application file for complete search history.

(56) References Cited

U.S. PATENT DOCUMENTS

| | | | | |
|---|---|---|---|---|
| 4,849,757 A | * | 7/1989 | Krenik ........................... | 341/167 |
| 5,216,426 A | * | 6/1993 | Ishioka ......................... | 341/168 |
| 5,565,869 A | * | 10/1996 | Brodie et al. ................. | 341/168 |
| 6,181,269 B1 | * | 1/2001 | Nishiuchi et al. ............. | 341/164 |
| 6,384,760 B1 | * | 5/2002 | Fuhrman ....................... | 341/168 |
| 7,733,136 B2 | * | 6/2010 | Chen et al. .................... | 327/148 |
| 7,733,250 B1 | * | 6/2010 | Tsyrganovich ............... | 341/118 |
| 2011/0102217 A1 | * | 5/2011 | Hsu ............................... | 341/120 |

* cited by examiner

*Primary Examiner* — Peguy Jean Pierre
(74) *Attorney, Agent, or Firm* — Rosenberg, Klein & Lee

(57) ABSTRACT

The present invention relates to an analog-to-digital converting circuit, which comprises an integrating circuit, a reference signal generating circuit, a comparator, and a first counting circuit. The integrating circuit integrates an input signal for producing an integration signal. The reference signal generating circuit produces a plurality of reference signals. The comparator receives the integration signal and the plurality of reference signals, and compares the integration signal to the plurality of reference signals sequentially for producing a plurality of comparison signals. The first counting circuit receives the plurality of comparison signals produced by the comparator, and starts to count the plurality of comparison signals for producing a reset signal and resetting the integrating circuit. Because the integrating circuit is not reset once until the comparator produces the plurality of comparison signals, the number of times of resetting the integrating circuit can be reduced, and hence reducing the integral nonlinearity effect. Accordingly, the accuracy of the analog-to-digital converting circuit is enhanced.

9 Claims, 4 Drawing Sheets

ANALOG-TO-DIGITAL CONVERTING CIRCUIT

FIELD OF THE INVENTION

The present invention relates generally to a converting circuit, and particularly to an analog-to-digital converting circuit.

BACKGROUND OF THE INVENTION

Presently, microcomputer systems own the capabilities of rapid computing and data storage. In current mechanical and electrical systems, controllers composed of microcomputers have long replaced the purely mechanical or the electrical and mechanical control mechanisms in the past time. The signals in microcomputers are digital, namely, the logic "0" and "1". The logic "0" represents the low voltage level, which is usually 0 volt in microcomputer systems; the logic "1" represents the high voltage, which is usually 5 volts in microcomputer systems. Nonetheless, physical phenomena in the natural world usually exhibit continuous input signals when they are expressed in quantities. Thereby, it is required to convert the signals for transferring variations of physical quantities in the outside world to microcomputers and computing or for driving devices pursuant to the commands of microcomputers.

The continuous signals of generally measured voltage or current are called input signals. A device converting input signals to digital signals is named an analog-to-digital converter (ADC). Various circuit structures can achieve the work of analog-to-digital conversion, including single-slope integrating ADC and double-slope integrating ADC.

Every ADC has an integrating circuit. As shown in FIG. 1, the input signal Iin is integrated by the integrating circuit comprising a capacitor C and an operational amplifier 12. The integration signal is produced at the output D of the operational amplifier 12. As shown in FIG. 2, the integration signal is a triangular-wave signal. A comparator 14 compares the integration signal to a reference signal Vref for producing a comparison signal. A counter 16 is coupled to the output of the comparator 14 for counting the comparison signal and thus counting a triangular-wave signal. Thereby, a digital signal can be produced. The comparison signal is further used as a reset signal RST for resetting the integrating circuit and producing a next integration signal, namely a next triangular-wave signal.

According to the above description, every time the comparator 14 compares the integration signal the reference signal and produces a comparison signal, the integrating circuit has to be reset for producing a next integration signal. Thereby, for a 12-bit ADC, the counter 16 has to count for 4096 times, and hence the integrating circuit has to be reset for 4096 times. The integrating circuit according to the prior art produces the integral nonlinearity (INL) error, which is accumulative. Therefore, the INL error increases according to the number of times of resetting the integrating circuit, deteriorating the accuracy of the ADC. Consequently, how to reduce the INL effect has become a major issue of modern ADCs.

Accordingly, the present invention provides an analog-to-digital converting circuit, which can reduce the number of times of resetting an integrating circuit, and thus reducing the problem of INL effect as described above.

SUMMARY

An objective of the present invention is to provide an analog-to-digital converting circuit, which uses a comparator to compare an integration signal to a plurality of reference signals sequentially for producing a plurality of comparison signals. A first counting circuit counts the plurality of comparison signals and produces a reset signal for resetting an integrating circuit. Because the integrating circuit is not reset once until the comparator produces the plurality of comparison signals, the number of times of resetting the integrating circuit can be reduced, and hence reducing the INL effect. Accordingly, the accuracy of the analog-to-digital converting circuit is enhanced.

The analog-to-digital converting circuit according to the present invention comprises an integrating circuit, a reference signal generating circuit, a comparator, and a first counting circuit, The integrating circuit integrates an input signal for producing an integration signal. The reference signal generating circuit produces a plurality of reference signals. The comparator receives the integration signal and the plurality of reference signals, and compares the integration signal to the plurality of reference signals sequentially for producing a plurality of comparison signals. The first counting circuit receives the plurality of comparison signals produced by the comparator, and starts to count the plurality of comparison signals for producing a reset signal and resetting the integrating circuit. Because the integrating circuit is not reset once until the comparator produces the plurality of comparison signals, the number of times of resetting the integrating circuit can be reduced, and hence reducing the INL effect. Accordingly, the accuracy of the analog-to-digital converting circuit is enhanced.

Moreover, the analog-to-digital converting circuit according to the present invention further comprises a second counting circuit and a latch circuit. The second counting circuit counts the resetting signal produced by the first counting circuit. The latch circuit receives counting signals of the first and second counting circuits for producing a latch signal.

DETAILED DESCRIPTION

In order to make the structure and characteristics as well as the effectiveness of the present invention to be further understood and recognized, the detailed description of the present invention is provided as follows along with embodiments and accompanying figures.

Figure 1:
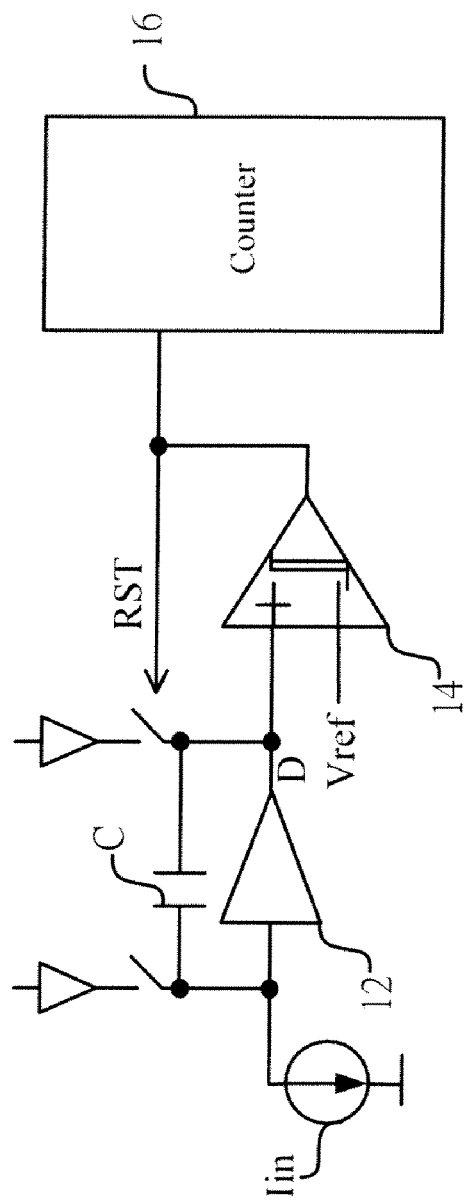
FIG. 1 shows a circuit diagram of an integrating circuit according to the prior art.
Figure 2:
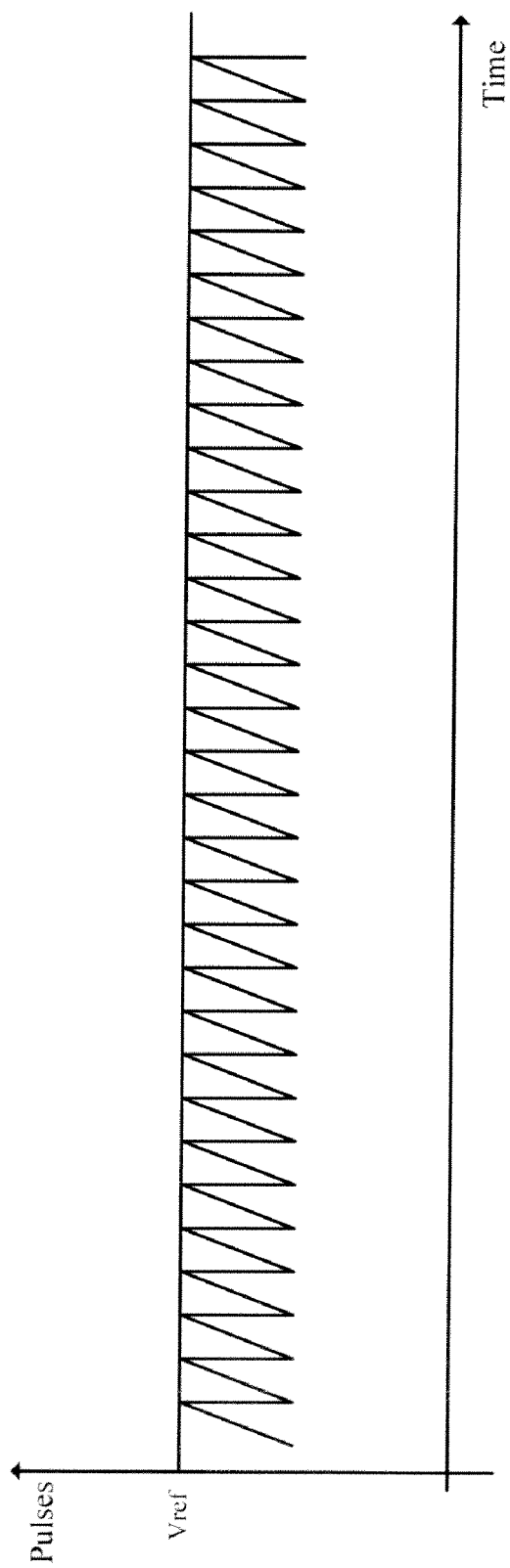
FIG. 2 shows a waveform of an integrating circuit according to the prior art.
Figure 3:
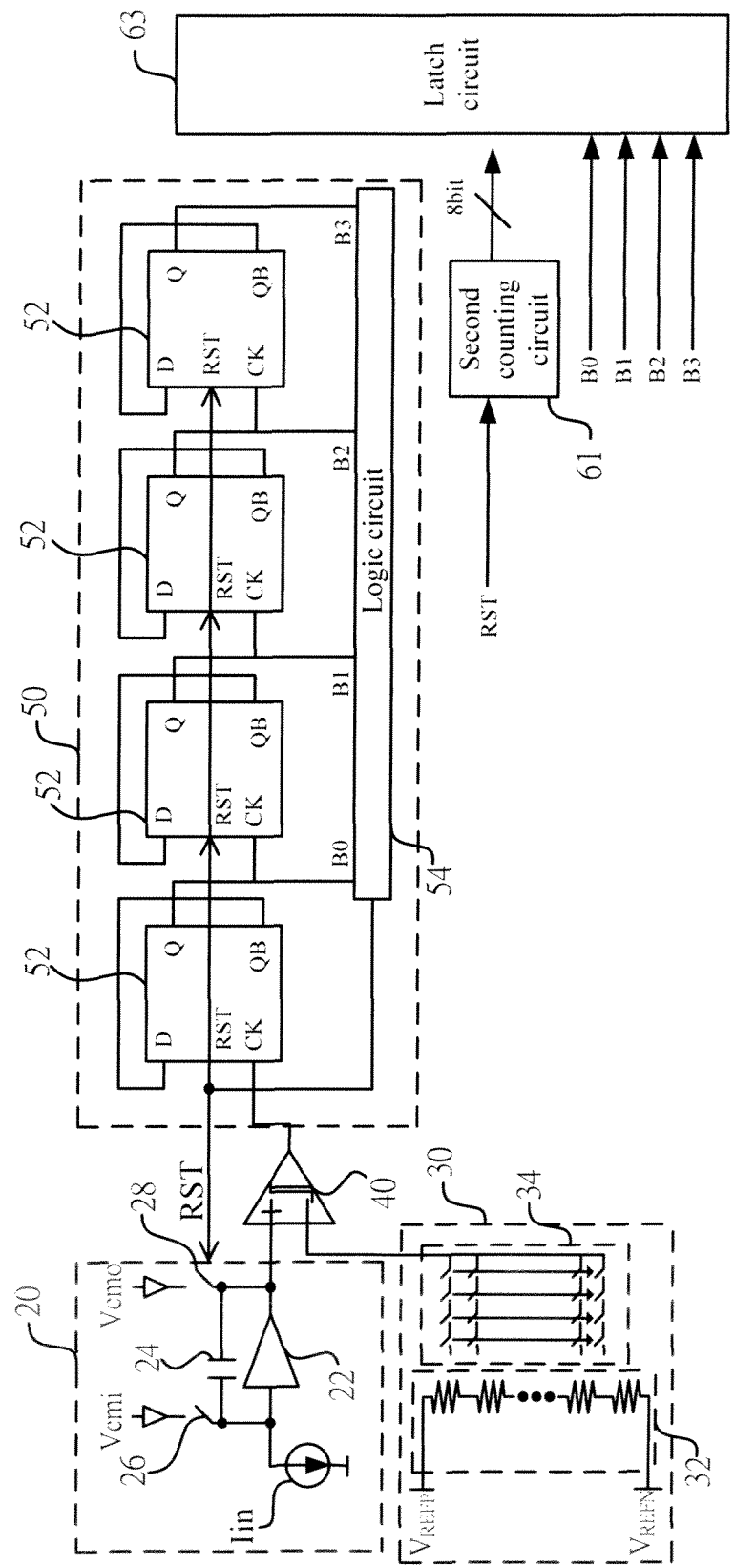
FIG. 3 shows a circuit diagram of an analog-to-digital converting circuit according to a preferred embodiment of the present invention.
Figure 4:
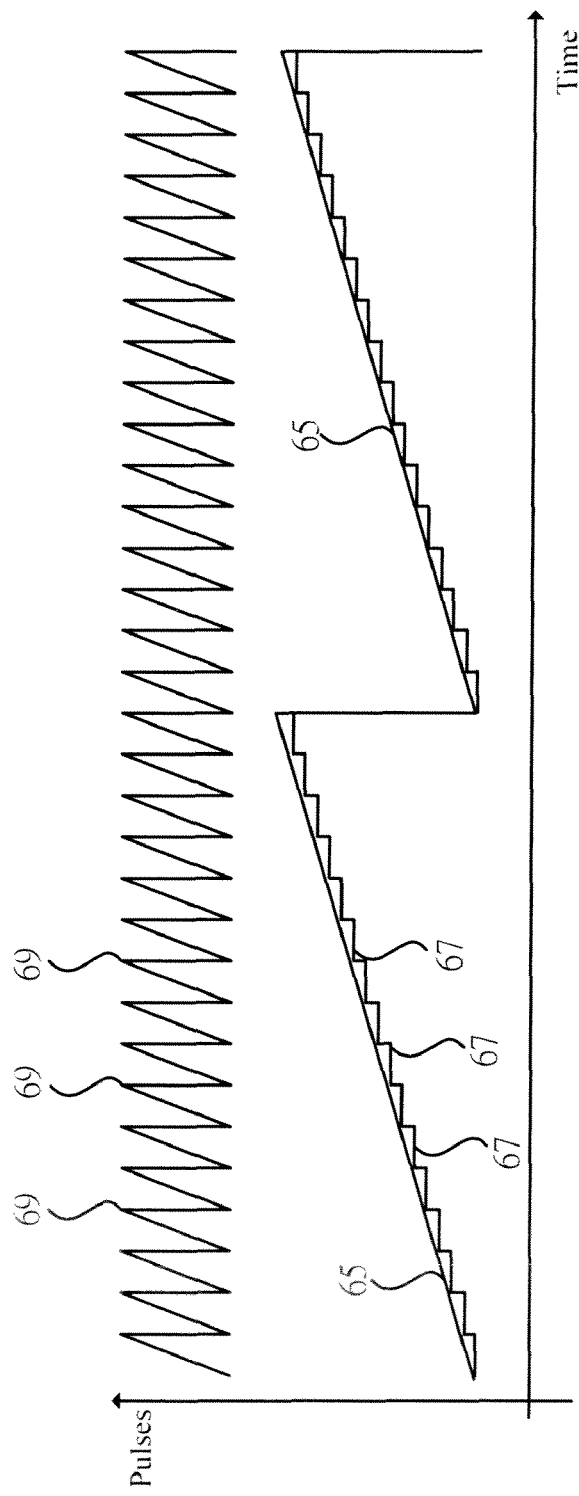
FIG. 4 shows a waveform of an analog-to-digital converting circuit according to a preferred embodiment of the present invention.

FIGS. 3 and 4 show a circuit diagram and a waveform of an analog-to-digital converting circuit according to a preferred embodiment of the present invention. As shown in the figures, the analog-to-digital converting circuit according to the present invention comprises an integrating circuit 20, a reference signal generating circuit 30, a comparator 40, and a first counting circuit 50. The integrating circuit 20 receives an input signal Iin, integrates the input signal Iin, and produces an integration signal 65 as shown in FIG. 4. According to the present embodiment, the input signal Iin is a current signal. The reference signal generating circuit 30 produces a plurality of reference signals sequentially. The positive input and the negative input of the comparator 40 receives the integration signal 65 produced by the integrating circuit 20 and the plurality of reference signals produced by the reference signal generating circuit 30, respectively, and compares the integration signal 65 to the plurality of reference signals sequentially for producing a plurality of comparison signals. A preferred embodiment of the comparator 40 of the analog-to-digital converting circuit according to the present invention is a comparator with hysteresis.

Referring again to FIG. 3, the first counting circuit 50 is coupled to the output of the comparator 40 for receiving and counting the plurality of comparison signals produced by the comparator 40. When the number of times for which the first counting circuit 50 counts the plurality of comparison signals reaches a threshold value, a reset signal RST is produced to reset the integrating circuit 20. The integrating circuit 20 is not reset once by the first counting circuit 50 until the comparator 40 compares the integration signal 65 to the plurality of reference signals and produces the plurality of comparison signals. Thereby, the number of times of resetting the integrating circuit 20 can be reduced, and hence reducing the INL error of the integrating circuit 20. Accordingly, the accuracy of the analog-to-digital converting circuit is enhanced.

In addition, the integrating circuit 20 of the analog-to-digital converting circuit according to the present invention further comprises an operational amplifier 22, a capacitor 24, a first discharging switch 26, and a second discharging switch 28. The input of the operational amplifier 22 receives the input signal Iin. The capacitor 24 is connected in parallel with the operational amplifier 22 for producing the integration signal 65. When the input signal Iin is input to the integrating circuit 20, the integrating circuit 20 integrates the input signal Iin and produces the integration signal 65. As shown in FIG. 4, the integration signal 65 of the analog-to-digital converting circuit according to the present invention is a triangular-wave signal. The first discharging switch 26 is coupled between a terminal of the capacitor 24 and a first discharging terminal $V_{cmi}$, and is controlled by the reset signal RST of the first counting circuit 50. The second discharging switch 28 is coupled between the other terminal of the capacitor 24 and a second discharging terminal $V_{cmo}$, and is also controlled by the reset signal RST of the first counting circuit 50. The first reset signal RST is used for closing the first and second discharging switches 26, 28 for discharging the capacitor 24 and thus resetting the integrating circuit 20. Then, the integrating circuit 20 will re-integrates the input signal Iin and produces a next integration signal 65, namely, a next triangular-wave signal.

As shown in FIG. 3, the reference signal generating circuit 30 of the analog-to-digital converting circuit according to the present invention further comprises a voltage-dividing circuit 32 and a switch module 34. The two terminals of the voltage-dividing circuit 32 receive a reference voltage $V_{REFP}$ and a reference level $V_{REFN}$, respectively. The voltage-dividing circuit 32 comprises a plurality of resistors connected in series for dividing the reference voltage $V_{REFP}$ and producing the plurality of reference signals 67 with different levels as shown in FIG. 4. The levels of the plurality of reference signals 67 increase gradually. The switch module 34 is coupled between the voltage-dividing circuit 32 and the comparator 40 for transmitting the plurality of reference signals 67 with different levels to the comparator 40 sequentially. The comparator 40 can then compares the integration signal 65 to the plurality of reference signals 67, and hence producing the plurality of comparison signals.

Once the level of the integration signal 65 is higher than the level of a reference signal 67 provided by the reference signal generating circuit 30, the switch module 34 will switch and transmit the next reference signal 67 with a higher level to the comparator 40. Because the level of the integration signal 65 increases gradually, the comparator 40 compares the integration signal 65 to the plurality of reference signals 67 and produces the plurality of comparison signals. Because the reference signal generating circuit 30 provides the reference signals 67 with different levels to the comparator 40 for being compared by the integration signal 65, each comparison signal produced by the comparator 40 corresponds to a small triangular-wave signal 69. Thereby, counting the number of the plurality of comparison signals by the first counting circuit is equivalent to counting the number of the triangular-wave signals 69. The switch module 34 according to the present invention is controlled by the first counting circuit 50. The first counting circuit 50 controls the switch module 34 for each count of the comparison signal in order to transmit the reference signals 67 with different levels to the comparator 40. The switch module 30 includes a plurality of switches coupled between the plurality of resistors of the voltage-dividing circuit 32 and the comparator 40 for providing the reference signals 67 with different levels to the comparator 40. Besides, the switches are controlled by the first counting circuit 50.

Referring again to FIG. 3, the first counting circuit 50 of the analog-to-digital circuit according to the present invention includes a counter and a logic circuit 54. According to the present embodiment, the counter includes a plurality of flip-flops 52 connected in series. The flip-flops 52 are D-type flip-flops 52. The input D of each flip-flop 52 is coupled to its inverse output QB. The clock input CK of the first flip-flop 52 is coupled to the output of the comparator 40 for receiving the comparison signals. In addition, except the last flip-flop 52, the output Q of every flip-flop 52 is coupled in series to the clock input CK of the next flip-flop 52. The outputs Q of the flip-flops 52 output binary counting signals B0 to B3, respectively. Counting the number of the comparison signals by the counter is equivalent to counting the number of the triangular-wave signals 69 and then outputting the corresponding counting signals B0 to B3. The counting signals B0 to B3 can be used as control signals for controlling the switch module 34. Thereby, the switches of the switch module 34 are controlled for transferring the reference signals 67 with different levels to the comparator 40. The counter according the present embodiment is implemented by a plurality of flip-flops 52. However, the counter of the first counting circuit 50 according to the present invention is not limited to be composed by flip-flops 52 only. A person having ordinary skill in the art can know that the counter can also be composed by other circuits generally used.

The logic circuit 54 is coupled to the counter for receiving the counting signals B0 to B3, and for knowing the number of the triangular-wave signals 69 in the counting signals B0 to B3. When the number of the triangular-wave signals 69 reaches a threshold value according to the counting signals B0 to B3, the logic circuit 54 produces the reset signal RST to reset the integrating circuit 20 for re-integrate the input signal Iin and producing a next new integration signal 65, namely, a next big triangular-wave signal. According to the present embodiment, the threshold value is pre-configured in the logic circuit 54 and is modifiable depending on usage. Besides, the reset signal RST also resets the counter of the first counting circuit 50. According to the present embodiment, the reset signal RST is used to reset the plurality of flip-flops 52 for recounting the plurality of comparison signals output by the comparator 40.

According to the description above, the first counting circuit 50 is used for counting the number of the plurality of comparison signals, namely, the number of the small triangular-wave signals 69. When the number of the comparison signals reaches the threshold value, the integration signal 65 is reset for producing a next integration signal and for resetting the counting signals B0 to B3. Thereby, each integration signal 65 comprises a fixed number of the small triangular-wave signals 69.

As shown in FIG. 3, the present invention further comprises a second counting circuit 61 and a latch circuit 63. The second counting circuit 61 receives the reset signals RST produced by the first counting circuit 50 and counts the reset signals RST for producing and transmitting a counting signal to the latch circuit 63. The counting signal produced by the second counting circuit 61 represents the number of integration signals 65, namely, the number of large triangular-wave signals produced by the integrating circuit 20. The latch circuit 63 is further coupled to the first counting circuit 50 for receiving the counting signals B0 to B3. In doing so, the latch circuit 63 can know the number of integration signals 65 and the number of small triangular-wave signals 69 contained in the integration signals 65 in accordance with the counting signals B0 to B3 of the first counting circuit 50 and the counting signal of the second counting circuit 61. That is to say, the total number of small triangular-wave signals 69 is the product of the number of integration signals 65 and the number of small triangular-wave signals 69 contained in each integration signal 65. The latch circuit 63 produces a latch signal for subsequent circuits according to the counting signals B0 to B3 of the first counting circuit 50 and the counting signal of the second counting circuit 61. The application of providing the latch signal to subsequent circuits differs for different circuit designs. It is not the major technical feature of the present invention, and hence will not be described in details.

Applying the analog-to-digital converting circuit according to the present invention can reduce the number of times of resetting the integrating circuit 20, and hence reducing the INL effect. Accordingly, the accuracy of the analog-to-digital converting circuit is enhanced. Taking a 12-bit analog-to-digital converting circuit for example, it has to produce 4096 small triangular-wave signals, and hence an integrating circuit of an analog-to-digital converting circuit according to the prior art has to be reset for 4096 times. On the contrary, the integrating circuit 20 according to the present invention needs not to be reset for 4096 times. Assume that the reference signal generating circuit 30 according to the present invention can provide 16 reference signals 67 with difference levels, which means that an integration signal 65 can contain 16 small triangular-wave signals 69. Then the first counting circuit 50 can be a 4-bit counting circuit and the second counting circuit 61 can be an 8-bit counting circuit for counting the number of the integration signals 65 and the 12-bit function can be achieved. In other words, the integrating circuit 20 according to the present invention needs to be reset for only 256 times, which is merely 1/16 of the number required according to the prior art. Thereby, the number of times of resetting the integrating circuit 20 is reduced, and hence reducing the INL effect. Accordingly, the accuracy of the analog-to-digital converting circuit is enhanced. The 4-bit counting circuit as the first counting circuit 50 and the 8-bit counting circuit as the second counting circuit 61 are only a preferred embodiment of the present invention. The first counting circuit 50 and the second counting circuit 61 can be designed in accordance with requirements of usage, and are not limited to the above embodiment.

To sum up, the analog-to-digital converting circuit according to the present invention comprises an integrating circuit, a reference signal generating circuit, a comparator, and a first counting circuit, The integrating circuit integrates an input signal for producing an integration signal. The reference signal generating circuit produces a plurality of reference signals. The comparator receives the integration signal and the plurality of reference signals, and compares the integration signal to the plurality of reference signals sequentially for producing a plurality of comparison signals. The first counting circuit receives the plurality of comparison signals produced by the comparator, and starts to count the plurality of comparison signals for producing a reset signal and resetting the integrating circuit. Thereby, the number of times of resetting the integrating circuit can be reduced, and hence reducing the INL effect. Accordingly, the accuracy of the analog-to-digital converting circuit is enhanced.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. An analog-to-digital converting circuit, comprising:
    an integrating circuit, integrating an analog input signal for producing an integration signal;
    a reference signal generating circuit, producing sequentially a plurality of reference signals;
    a comparator, receiving said integration signal and said plurality of reference signals, and comparing sequentially said integration signal to said plurality of reference signals for producing sequentially a plurality of comparison signals;
    a first counting circuit, receiving and counting said plurality of comparison signals for producing a reset signal and a digital counting signal, said reset signal being used to reset said integrating circuit and said first counting circuit; and a second counting circuit, coupled to said first counting circuit for counting said reset signal and producing a digital counting signal.

2. The analog-to-digital converting circuit of claim 1, wherein said reference signal generating circuit further comprises:
    a voltage-dividing circuit, receiving a reference voltage, and producing said plurality of reference signals; and
    a switch module, coupled between said voltage-dividing circuit and said comparator for transmitting sequentially said plurality of reference signals to said comparator, and controlled by said first counting circuit.

3. The analog-to-digital converting circuit of claim 2, wherein said voltage-dividing circuit includes a plurality of resistors connected in series.

4. The analog-to-digital converting circuit of claim 1, wherein said integrating circuit further comprises:
    an operational amplifier, receiving said analog input signal;
    a capacitor, connected in parallel with said operational amplifier for producing said integration signal;
    a first discharging switch, coupled between a terminal of said capacitor and a first discharging terminal, and controlled by said first counting circuit; and a second discharging switch, coupled between the other terminal of said capacitor and a second discharging terminal, and controlled by said first counting circuit.

5. The analog-to-digital converting circuit of claim 1, wherein said integration signal is a triangular-wave signal.

6. The analog-to-digital converting circuit of claim 1, wherein said comparator is a comparator with hysteresis.

7. The analog-to-digital converting circuit of claim 1, wherein said first counting circuit includes:

a counter, counting said plurality of comparison signals for producing said digital counting signal of said first counting circuit; and a logic circuit, producing said reset signal according to said digital counting signal of said first counting circuit.

8. The analog-to-digital converting circuit of claim 7, wherein said counter further includes a plurality of flip-flops connected in series for counting said plurality of comparison signals and producing said digital counting signal of said first counting circuit.

9. The analog-to-digital converting circuit of claim 1, and further comprising:

a latch circuit, receiving said digital counting signals of said first counting circuit and said second counting circuit for producing a latch signal.

* * * * *